(12) United States Patent
Guo (10) Patent No.: US 7,924,085 B2
(45) Date of Patent: Apr. 12, 2011

(54) NEGATIVE ANALOG SWITCH DESIGN

(75) Inventor: Dianbo Guo, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 11 days.

(21) Appl. No.: 12/488,287

(22) Filed: Jun. 19, 2009

(65) Prior Publication Data
US 2010/0321100 A1    Dec. 23, 2010

(51) Int. Cl.
*H03K 3/01* (2006.01)
(52) U.S. Cl. ........................ 327/534; 327/404
(58) Field of Classification Search .................. 327/403, 327/404, 534, 537
See application file for complete search history.

(56) References Cited

U.S. PATENT DOCUMENTS

| | | | |
|---|---|---|---|
| 5,332,916 A * | 7/1994 | Hirai | 257/369 |
| 6,169,443 B1 * | 1/2001 | Shigehara et al. | 327/534 |
| 7,514,983 B2 * | 4/2009 | Miske | 327/534 |

* cited by examiner

*Primary Examiner* — Jeffrey S Zweizig
(74) *Attorney, Agent, or Firm* — Lisa K. Jorgenson; Andre M. Szuwalski (57) ABSTRACT

A transmission gate includes first and second MOS transistors of opposite conductivity type coupled in parallel with each other. Each transistor includes a body connection that is separately biased by corresponding first and second biasing circuits. The first biasing circuit generates a first bias voltage having a voltage level that is generated as a function of the signal at the first node and a first (for example, positive) reference voltage. The second biasing circuit generates a second bias voltage having a voltage level that is generated as a function of the signal at the first node and a second (for examples ground) reference voltage.

15 Claims, 4 Drawing Sheets

NEGATIVE ANALOG SWITCH DESIGN

BACKGROUND OF THE INVENTION

1. Technical Field of the Invention

The present invention relates generally to an analog switch formed from CMOS devices and, more particularly, to a negative analog switch.

2. Description of Related Art

Figure 1:
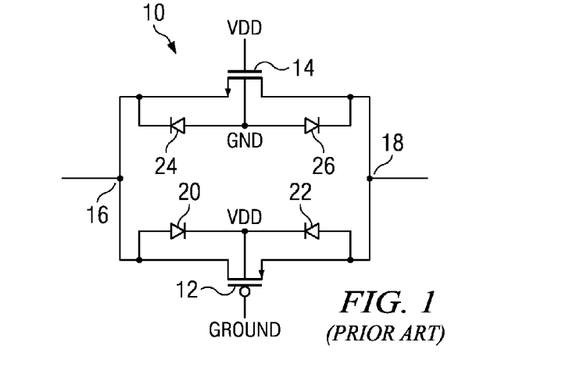
FIG. 1 is a schematic diagram of a prior art single MOS analog switch circuit.

An analog switch circuit, also referred to in the art as a transmission gate, is a widely used basic circuit component. A conventional analog switch circuit is shown in FIG. 1 to include a pair of MOS transistors connected in parallel. More particularly, the analog switch 10 includes a PMOS transistor 12 and an NMOS transistor 14 whose source/drain paths are connected in parallel. The source of the NMOS transistor 14 is connected to the drain of the PMOS transistor 12 to form a first terminal 16 of the analog switch 10. The source of the PMOS transistor 12 is connected to the drain of the NMOS transistor 14 to form a second terminal 18 of the analog switch 10. The PMOS transistor 12 includes first and second body diodes 20 and 22. The NMOS transistor 14 includes first and second body diodes 24 and 26.

The gates of the two transistors 12 and 14 receive control signals to turn on the analog switch and thus connect the first terminal 16 to the second terminal 18. For example, the analog switch is turned on when a positive voltage Vdd is applied to the gate of the NMOS transistor 14 and ground Gnd is applied to the gate of the PMOS transistor 12. The body of the PMOS transistor is connected to the positive voltage Vdd while the body of the NMOS transistor is connected to ground Gnd.

Figure 2:
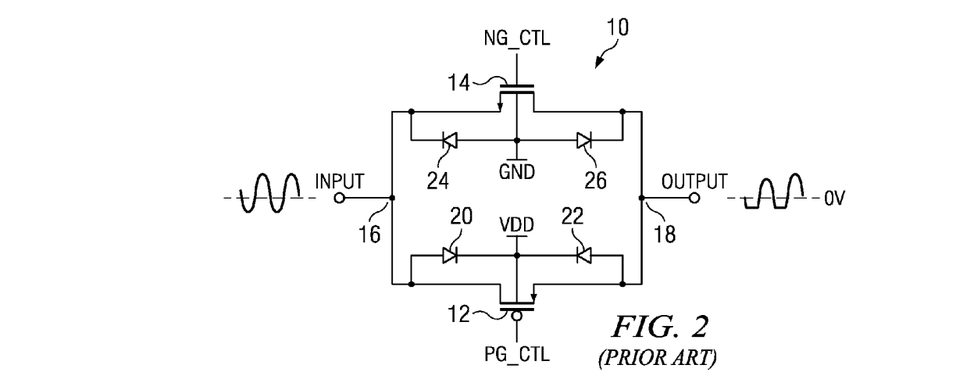
FIG. 2 shows operation of the analog switch of FIG. 1 to pass an analog signal.

Reference is now made to FIG. 2 which shows operation of the analog switch of FIG. 1 to pass an analog signal. The gate of the PMOS transistor 12 receives a control signal PG_CTL while the gate of the NMOS transistor 14 receives a control signal NG_CTL. An analog signal (for example, of the form shown as a sine wave) is applied to the first terminal 16 (Input). The control signal PG_CTL is set to ground Gnd and the control signal NG_CTL is set to the positive voltage Vdd. Both the PMOS transistor 12 and the NMOS transistor 14 are turned on. If the analog signal at the first terminal 16 falls below −0.7 V, the body diodes 24 and 26 of the NMOS transistor 14 will become forward biased. This will result in a distortion of the signal (as shown) at the second terminal 18 (Output), and further could result in damage to the analog switch 10.

Figure 3:
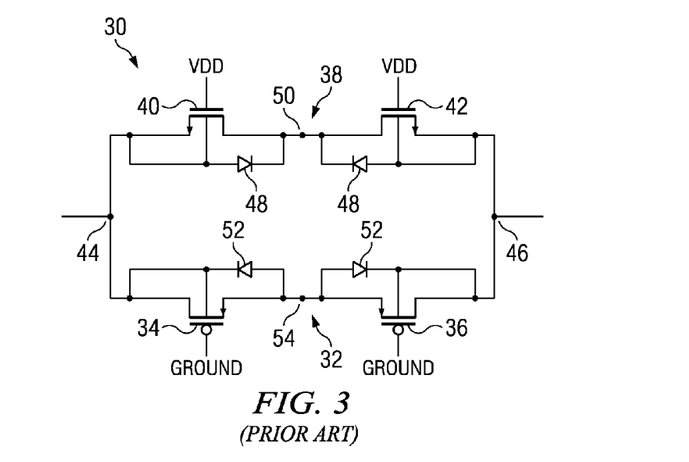
FIG. 3 is a schematic diagram of a prior art double MOS analog switch circuit.

FIG. 3 shows an analog switch circuit which addresses the foregoing problem of the FIG. 1 switch design. The analog switch 30 of FIG. 3 includes a PMOS circuit 32 including first and second PMOS transistors 34 and 36 connected in series. The analog switch further includes an NMOS circuit 38 including first and second NMOS transistors 40 and 42 connected in series. The PMOS circuit 32 and NMOS circuit 38 are connected in parallel. The source of the NMOS transistor 40 is connected to the drain of the PMOS transistor 34 to form a first terminal 44 of the analog switch 30. The source of the NMOS transistor 42 is connected to the drain of the PMOS transistor 36 to form a second terminal 46 of the analog switch 30. The body of PMOS transistor 34 is shorted to the first terminal 44, and a body diode 48 is present between the body of PMOS transistor 34 and a first series connection node 50. The body of PMOS transistor 36 is shorted to the second terminal 46, and a body diode 48 is present between the body of PMOS transistor 36 and the first series connection node 50. The body of NMOS transistor 40 is shorted to the first terminal 44, and a body diode 52 is present between the body of NMOS transistor 40 and a second series connection node 54. The body of NMOS transistor 42 is shorted to the second terminal 46, and a body diode 52 is present between the body of NMOS transistor 42 and the second series connection node 54.

Figure 4:
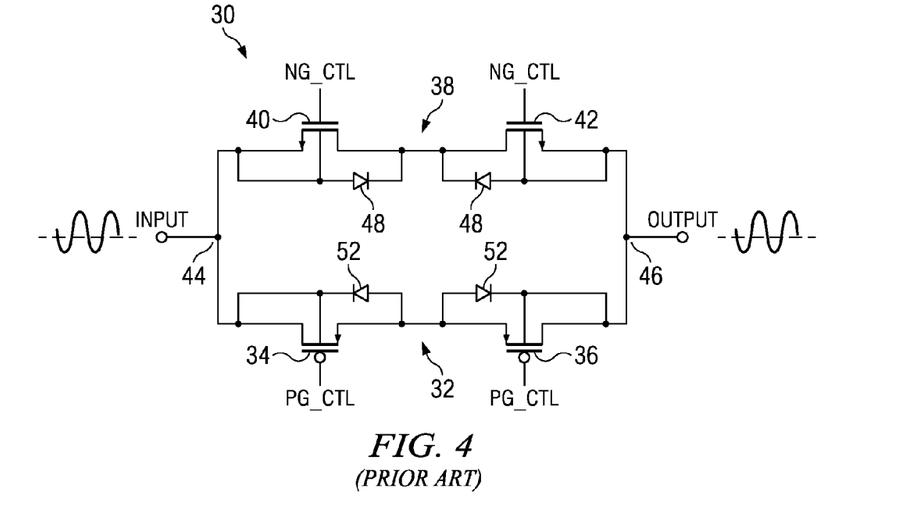
FIG. 4 shows operation of the analog switch of FIG. 3 to pass an analog signal.

Reference is now made to FIG. 4 which shows operation of the analog switch of FIG. 3 to pass an analog signal. The gates of the PMOS transistors 34 and 36 receive a control signal PG_CTL while the gates of the NMOS transistors 40 and 42 receive a control signal NG_CTL. An analog signal (for example, of the form shown as a sine wave) is applied to the first terminal 44 (Input). The control signal PG_CTL is ground Gnd and the control signal NG_CTL is the positive voltage Vdd. The PMOS transistors 34 and 36 and the NMOS transistors 40 and 42 are turned on. Because of the series connected transistors in each circuit 32 and 38, the voltage drop across each included transistor is less than 0.7 V, so the body diodes 48 and/or 52 do not turn on and there is no distortion of the signal at the second terminal 46 (as shown).

While the FIG. 3 analog switch circuit addresses the problem associated with the FIG. 1 analog switch circuit, a drawback of the FIG. 3 analog switch circuit is that the area required to fabricate the transmission gate circuit between input and output nodes must be much larger than the area of the FIG. 1 analog switch circuit in order to achieve a same on-resistance value. A need exists for an analog switch which addresses the problems of the FIG. 1 circuit and where the transmission gate itself does not require the same die area as the FIG. 3 circuit.

SUMMARY OF THE INVENTION

In an embodiment, a circuit comprises: a first node adapted to receive a signal; a second node adapted to output the signal; and a transmission gate formed solely of first and second MOS transistors coupled in parallel with each other between the first node and second node, the first MOS transistor being of a first conductivity type and having a first body connection, the second MOS transistor being of a second conductivity type and having a second body connection. A first bias circuit is adapted to generate a first bias voltage for application to the first body connection, that first bias voltage being generated as a function of the signal at the first node. A second bias circuit is adapted to generate a second bias voltage for application to the second body connection, that second bias voltage being generated as a function of the signal at the first node.

In an embodiment, a circuit comprises: a first node; a second node; and a transmission gate formed solely of first and second MOS transistors coupled in parallel with each other between the first node and second node, the first MOS transistor being of a first conductivity type and having a first body connection, the second MOS transistor being of a second conductivity type and having a second body connection. A first bias circuit is adapted to generate a first bias voltage for application to the first body connection, that first bias voltage being generated as a function of the signals at the first and second nodes. A second bias circuit is adapted to generate a second bias voltage for application to the second body connection, that second bias voltage being generated as a function of the signals at the first and second nodes.

In another embodiment, a circuit comprises: a first node adapted to receive a signal; a second node adapted to output the signal; and a transmission gate formed solely of first and second MOS transistors coupled in parallel with each other between the first node and second node, the first MOS transistor being of a first conductivity type and having a first body connection, the second MOS transistor being of a second conductivity type and having a second body connection. A first bias circuit is adapted to generate a first bias voltage for application to the first body connection, that first bias voltage having a voltage level that is either a positive reference voltage or a voltage in excess of the positive reference voltage proportional to a positive voltage of the signal received at the first node. A second bias circuit is adapted to generate a second bias voltage for application to the second body connection, that second bias voltage having a voltage level that is either a ground reference voltage or a voltage less than the ground reference voltage proportional to a negative voltage of the signal received at the first node.

In another embodiment, a method comprises: passing a signal through an analog transmission gate formed solely of first and second MOS transistors coupled in parallel with each other between a first node and a second node, the first MOS transistor being of a first conductivity type and having a first body connection, the second MOS transistor being of a second conductivity type and having a second body connection; applying a first bias voltage to the first body connection, that first bias voltage having a voltage level that is generated as a function of the signal at the first node and a positive reference voltage; and applying a second bias voltage to the second body connection, that second bias voltage having a voltage level that is generated as a function of the signal at the first node and a ground reference voltage.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 5:
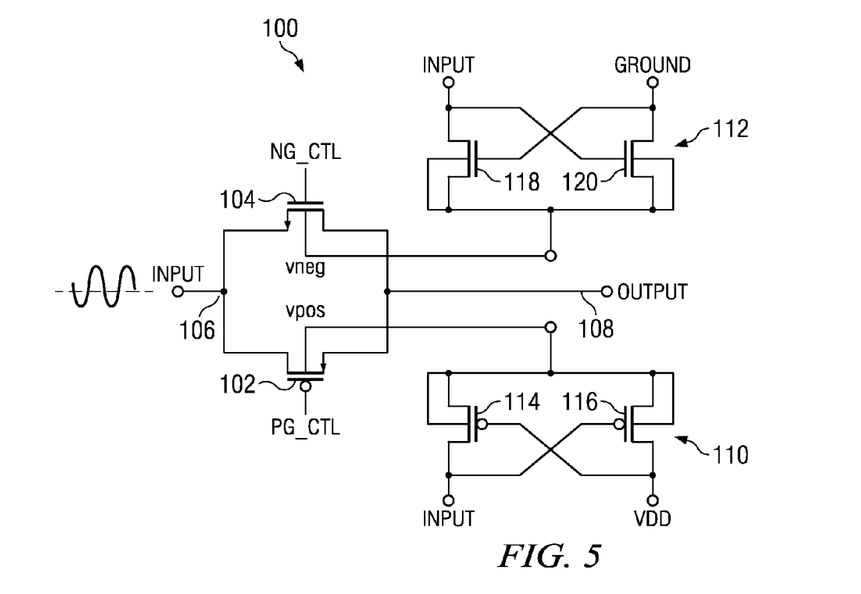
FIG. 5 is a schematic diagram of a first embodiment of an analog switch circuit.

Reference is now made to FIG. 5 wherein there is shown a schematic diagram of a first embodiment of an analog switch circuit. The analog switch circuit 100 includes a pair of MOS transistors connected in parallel. More particularly, the analog switch 100 includes a PMOS transistor 102 and an NMOS transistor 104 whose source/drain paths are connected in parallel. The source of the NMOS transistor 104 is connected to the drain of the PMOS transistor 102 to form a first terminal (Input) 106 of the analog switch 100. The source of the PMOS transistor 102 is connected to the drain of the NMOS transistor 104 to form a second terminal (Output) 108 of the analog switch 100. Although not specifically illustrated, it will be understood that the PMOS transistor 102 includes body diodes (see, FIG. 1) and the NMOS transistor 104 also includes body diodes (see, FIG. 1).

The gates of the two transistors 102 and 104 receive control signals to turn on the analog switch and thus connect the first terminal 106 to the second terminal 108. For example, the analog switch is turned on when a positive voltage Vdd is applied to the gate of the NMOS transistor 104 (with control signal NG_CTL) and ground Gnd is applied to the gate of the PMOS transistor 102 (with control signal PG_CTL). The body of the PMOS transistor 102 is biased by a bias voltage vpos generated by a first bias voltage circuit 110. The body of the NMOS transistor 104 is biased by a bias voltage vneg generated by a second bias voltage circuit 112.

The first bias voltage circuit 110 is formed by a pair of cross-coupled PMOS transistors 114 and 116. The PMOS transistor 114 includes a first source/drain terminal coupled to the first terminal (Input) 106 of the analog switch 100, and a second drain/source terminal coupled to the body of the PMOS transistor 102 and providing the bias voltage vpos. A gate terminal of the PMOS transistor 114 is coupled to a positive voltage Vdd. The PMOS transistor 116 includes a first source/drain terminal coupled to the positive voltage Vdd, and a second drain/source terminal coupled to the body of the PMOS transistor 102 and providing the bias voltage vpos. A gate terminal of the PMOS transistor 116 is coupled to the first terminal (Input) 106 of the analog switch 100. The bodies of the transistors 114 and 116 are connected to the node providing the bias voltage vpos.

Figure 6A:
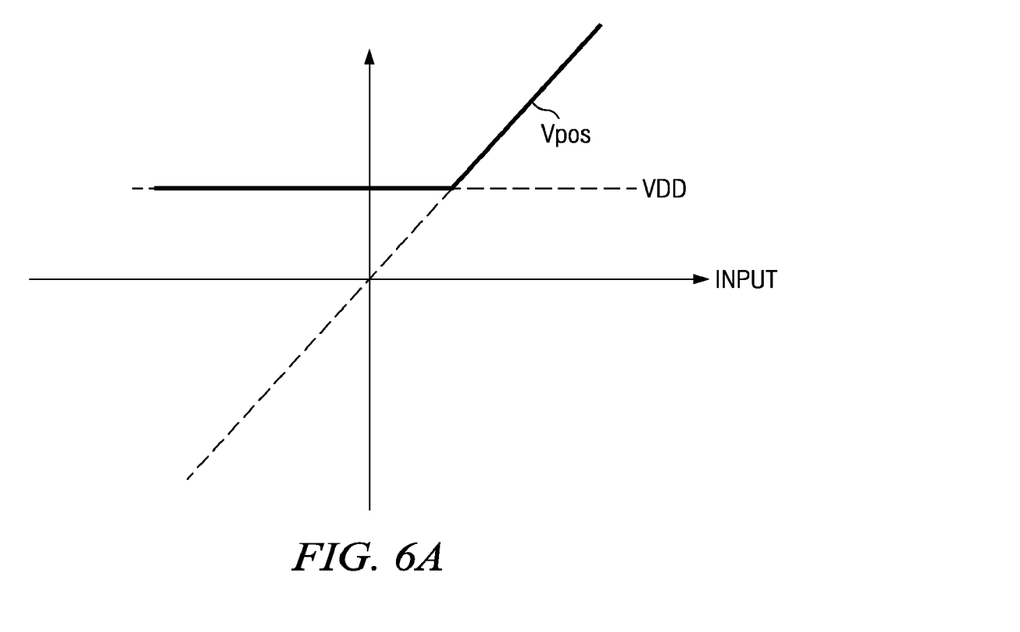
FIG. 6A illustrates the bias voltage vpos as a function of the input voltage.

FIG. 6A illustrates the bias voltage vpos generated by a first bias voltage circuit 110 as a function of the input voltage received at the first terminal (Input) 106 of the analog switch 100. Thus, it will be noted that the first bias voltage circuit 110 generates the bias voltage vpos to be equal to the positive voltage Vdd for input voltages below a certain threshold, and increase proportionally with increases in the input voltage above that certain threshold. With reference to FIG. 1, this adjustable bias voltage on the body of the PMOS transistor 102 prevents the body diodes 20 and 22 from becoming forward biased in response to the analog input signal received at the first terminal (Input) 106 of the analog switch 100.

The second bias voltage circuit 112 is formed by a pair of cross-coupled NMOS transistors 118 and 120. The NMOS transistor 118 includes a first source/drain terminal coupled to the first terminal (Input) 106 of the analog switch 100, and a second drain/source terminal coupled to the body of the NMOS transistor 104 and providing the bias voltage vneg. A gate terminal of the NMOS transistor 118 is coupled to a ground voltage Gnd. The NMOS transistor 120 includes a first source/drain terminal coupled to the ground voltage Gnd, and a second drain/source terminal coupled to the body of the NMOS transistor 104 and providing the bias voltage vneg. A gate terminal of the NMOS transistor 120 is coupled to the first terminal (Input) 106 of the analog switch 100. The bodies of the transistors 118 and 120 are connected to the node providing the bias voltage vneg.

Figure 6B:
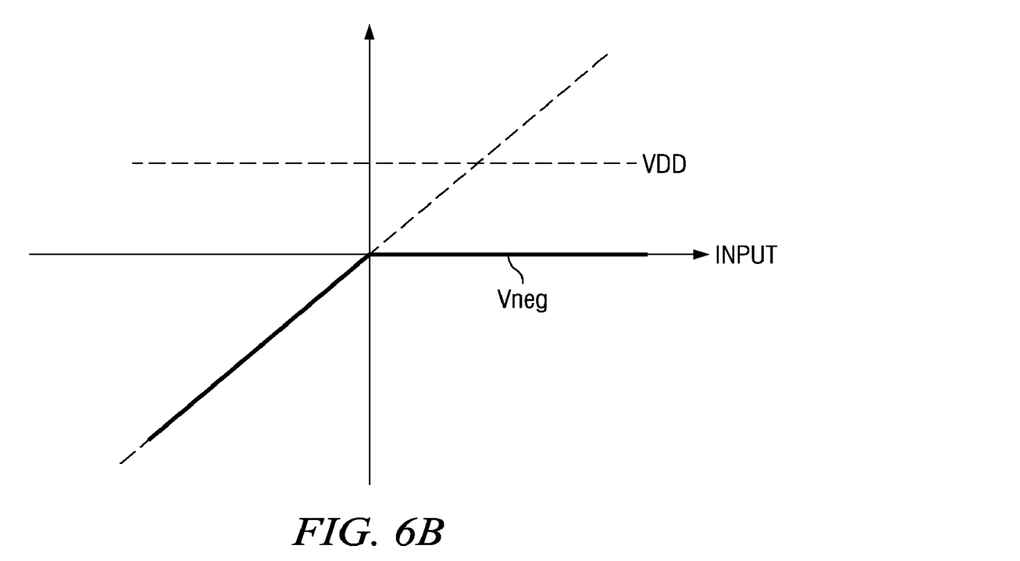
FIG. 6B illustrates the bias voltage vneg as a function of the input voltage.

FIG. 6B illustrates the bias voltage vneg generated by the second bias voltage circuit 112 as a function of the input voltage received at the first terminal (Input) 106 of the analog switch 100. Thus, it will be noted that the first bias voltage circuit 112 generates the bias voltage vpos to be equal to the ground voltage Gnd for input voltages above a certain threshold, and decrease proportionally with decreases in the input voltage below that certain threshold. With reference to FIG. 1, this adjustable bias voltage on the body of the NMOS transistor 104 prevents the body diodes 24 and 26 from becoming forward biased in response to the analog input signal received at the first terminal (Input) 106 of the analog switch 100.

The analog switch circuit 100 of FIG. 5 is unidirectional in operation. The input signal must be applied to the first terminal (Input) 106 and passed selectively (in response to the state of the control signals applied to the gates of the transistors 102 and 104) to the second terminal (Output) 108. The circuit will not operate properly in a reverse direction (i.e., from terminal 108 to terminal 106). However, there is a need, in some circuit implementations, for bi-directional operation. This need is addressed by the following circuit.

Figure 7:
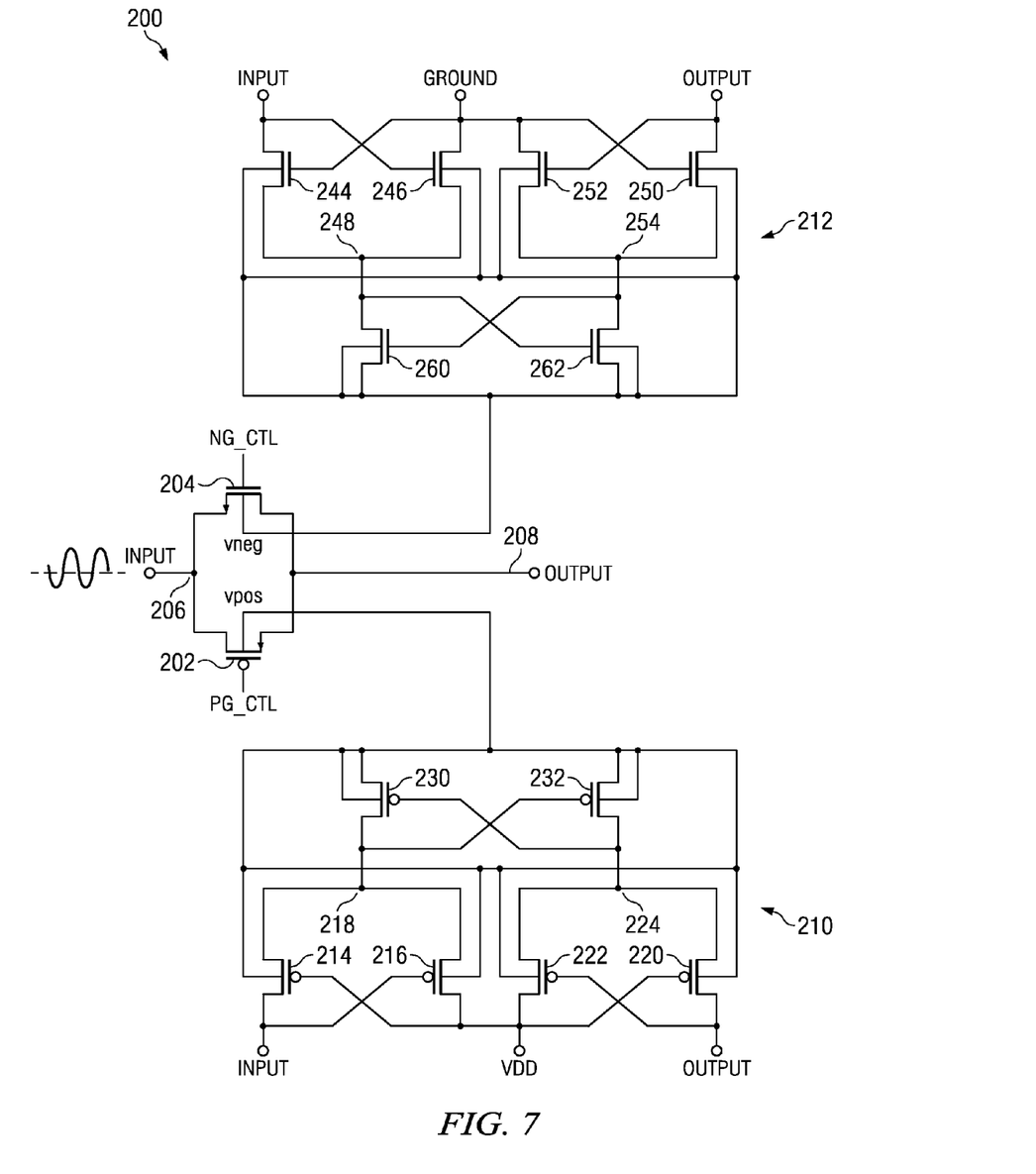
FIG. 7 is a schematic diagram of a second embodiment of an analog switch circuit.

Reference is now made to FIG. 7 wherein there is shown a schematic diagram of a second embodiment of an analog switch circuit. The analog switch circuit 200 includes a pair of MOS transistors connected in parallel. More particularly, the analog switch 200 includes a PMOS transistor 202 and an NMOS transistor 204 whose source/drain paths are connected in parallel. The source of the NMOS transistor 204 is connected to the drain of the PMOS transistor 202 to form a first terminal (Input) 206 of the analog switch 200. The source of the PMOS transistor 202 is connected to the drain of the NMOS transistor 204 to form a second terminal (Output) 208 of the analog switch 200. Although not specifically illustrated, it will be understood that the PMOS transistor 202 includes body diodes (see, FIG. 1) and the NMOS transistor 204 also includes body diodes (see, FIG. 1).

The gates of the two transistors 202 and 204 receive control signals to turn on the analog switch and thus connect the first terminal 206 to the second terminal 208. For example, the analog switch is turned on when a positive voltage Vdd is applied to the gate of the NMOS transistor 204 (with control signal NG_CTL) and ground Gnd is applied to the gate of the PMOS transistor 202 (with control signal PG_CTL). The body of the PMOS transistor 202 is biased by a bias voltage vpos generated by a first bias voltage circuit 210. The body of the NMOS transistor 104 is biased by a bias voltage vneg generated by a second bias voltage circuit 212.

The first bias voltage circuit 210 is formed by three interconnected pairs of cross-coupled PMOS transistors. A first pair includes cross-coupled PMOS transistors 214 and 216. The PMOS transistor 214 includes a first source/drain terminal coupled to the first terminal (Input) 206 of the analog switch 200, and a second drain/source terminal at node 218. A gate terminal of the PMOS transistor 214 is coupled to a positive voltage Vdd. The PMOS transistor 216 includes a first source/drain terminal coupled to the positive voltage Vdd, and a second drain/source terminal coupled to node 218. A gate terminal of the PMOS transistor 216 is coupled to the first terminal (Input) 206 of the analog switch 200. The bodies of the transistors 214 and 216 are connected to the node providing the bias voltage vpos.

A second pair includes cross-coupled PMOS transistors 220 and 222. The PMOS transistor 220 includes a first source/drain terminal coupled to the second terminal (Output) 208 of the analog switch 200, and a second drain/source terminal at node 224. A gate terminal of the PMOS transistor 220 is coupled to a positive voltage Vdd. The PMOS transistor 222 includes a first source/drain terminal coupled to the positive voltage Vdd, and a second drain/source terminal coupled to node 224. A gate terminal of the PMOS transistor 222 is coupled to the second terminal (Output) 208 of the analog switch 200. The bodies of the transistors 220 and 222 are connected to the node providing the bias voltage vpos.

A third pair includes cross-coupled PMOS transistors 230 and 232. The PMOS transistor 230 includes a first source/drain terminal coupled to the node 218, and a second drain/source terminal coupled to the body of the PMOS transistor 202 and providing the bias voltage vpos. The PMOS transistor 232 includes a first source/drain terminal coupled to the node 224, and a second drain/source terminal coupled to the body of the PMOS transistor 202 and providing the bias voltage vpos. A gate terminal of the PMOS transistor 230 is coupled to node 224, and a gate terminal of the PMOS transistor 232 is coupled to node 218. The bodies of the transistors 230 and 232 are connected to the node providing the bias voltage vpos.

The second bias voltage circuit 212 is formed by three interconnected pairs of cross-coupled NMOS transistors. A first pair includes cross-coupled NMOS transistors 244 and 246. The NMOS transistor 244 includes a first source/drain terminal coupled to the first terminal (Input) 206 of the analog switch 200, and a second drain/source terminal at node 248. A gate terminal of the NMOS transistor 244 is coupled to a ground voltage Gnd. The NMOS transistor 246 includes a first source/drain terminal coupled to the ground voltage Gnd, and a second drain/source terminal coupled to node 248. A gate terminal of the NMOS transistor 246 is coupled to the first terminal (Input) 206 of the analog switch 200. The bodies of the transistors 244 and 246 are connected to the node providing the bias voltage vneg.

A second pair includes cross-coupled NMOS transistors 250 and 252. The NMOS transistor 250 includes a first source/drain terminal coupled to the second terminal (Output) 208 of the analog switch 200, and a second drain/source terminal at node 254. A gate terminal of the NMOS transistor 250 is coupled to a ground voltage Gnd. The NMOS transistor 252 includes a first source/drain terminal coupled to the positive voltage Vdd, and a second drain/source terminal coupled to node 254. A gate terminal of the NMOS transistor 252 is coupled to the second terminal (Output) 208 of the analog switch 200. The bodies of the transistors 250 and 252 are connected to the node providing the bias voltage vneg.

A third pair includes cross-coupled NMOS transistors 260 and 262. The NMOS transistor 260 includes a first source/drain terminal coupled to the node 248, and a second drain/source terminal coupled to the body of the NMOS transistor 204 and providing the bias voltage vneg. The NMOS transistor 262 includes a first source/drain terminal coupled to the node 254, and a second drain/source terminal coupled to the body of the NMOS transistor 204 and providing the bias voltage vneg. A gate terminal of the NMOS transistor 260 is coupled to node 254, and a gate terminal of the NMOS transistor 262 is coupled to node 248. The bodies of the transistors 260 and 262 are connected to the node providing the bias voltage vneg.

The circuits of FIGS. 5 and 7 advantageously provide for an analog switch (transmission gate) including only two transistors (one PMOS and one NMOS), as shown in FIG. 1, forming the signal path between a first node (input) and second node (output). The included bias voltage circuits control the bias voltage applied to the bodies of the transmission gate transistors in response to the signal being passed so as to preclude circumstances where the body diodes of one or the other of the included transmission gate transistors become forward biased. The circuits of FIGS. 5 and 7 advantageously provide for an analog switch (transmission gate) which does not need additional series connected transmission gate transistors like the circuit of FIG. 3.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
a first node adapted to receive a signal;
a second node adapted to output the signal; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage being generated as a function of the signal at the first node; and
a second bias circuit adapted to generate a second bias voltage for application to the second body connection, that second bias voltage being generated as a function of the signal at the first node;
wherein the first bias circuit comprises: third and fourth cross-coupled MOS transistors of the first conductivity type, wherein a gate of the third transistor is coupled to a positive reference voltage node and a gate of the fourth transistor is coupled to receive the signal from the first node, and wherein drains of the third and fourth cross-coupled MOS transistors are connected together and directly connected to the first body connection.

2. The circuit of claim 1 wherein the second bias circuit comprises: fifth and sixth cross-coupled MOS transistors of the second conductivity type, wherein a gate of the fifth transistor is coupled to a ground reference voltage node and a gate of the sixth transistor is coupled to receive the signal from the first node, and wherein drains of the fifth and sixth cross-coupled MOS transistors are connected together and directly connected to the second body connection.

3. A circuit comprising:
a first node adapted to receive a signal;
a second node adapted to output the signal; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage being generated as a function of the signal at the first node; and
a second bias circuit adapted to generate a second bias voltage for application to the second body connection, that second bias voltage being generated as a function of the signal at the first node;
wherein the second bias circuit comprises: fifth and sixth cross-coupled MOS transistors of the second conductivity type and wherein a gate of the fifth transistor is coupled to a ground reference voltage node and a gate of the sixth transistor is coupled to receive the signal from the first node.

4. A circuit comprising:
a first node adapted to receive a signal;
a second node adapted to output the signal; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage being generated as a function of the signal at the first node; and
a second bias circuit adapted to generate a second bias voltage for application to the second body connection, that second bias voltage being generated as a function of the signal at the first node;
wherein the first bias circuit comprises: third and fourth cross-coupled MOS transistors of the first conductivity type and wherein a gate of the third transistor is coupled to a positive reference voltage node and a gate of the fourth transistor is coupled to receive the signal from the first node; and
wherein the second bias circuit comprises: fifth and sixth cross-coupled MOS transistors of the second conductivity type and wherein a gate of the fifth transistor is coupled to a ground reference voltage node and a gate of the sixth transistor is coupled to receive the signal from the first node.

5. A circuit comprising:
a first node;
a second node; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage being generated as a function of the signals at the first and second nodes; and
a second bias circuit adapted to generate a second bias voltage for application to the second body connection, that second bias voltage being generated as a function of the signals at the first and second nodes;
wherein the first bias circuit comprises: third and fourth cross-coupled MOS transistors of the first conductivity type,. wherein a gate of the third transistor is coupled to a third node and a gate of the fourth transistor is coupled to a fourth node, and wherein voltages at the third and fourth nodes are generated as a function of the signals at the first and second nodes and a positive reference voltage node.

6. The circuit of claim 5 wherein the first bias circuit further comprises a first circuit coupled to the first and second nodes and the positive reference voltage node and adapted to apply voltages to the third and fourth nodes at either the positive reference voltage or a voltage in excess of the positive reference voltage proportional to a positive voltage at one of the first and second nodes.

7. The circuit of claim 6 wherein the first circuit applies a voltage to the third node which is a function of the signals at the first node and the positive reference voltage node, and applies a voltage to the fourth node which is a function of the signals at the second node and the positive reference voltage node.

8. A circuit comprising:
a first node;
a second node; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;

a first bias circuit adapted to generate a first bias voltage for application to the first body connection, that first bias voltage being generated as a function of the signals at the first and second nodes; and a second bias circuit adapted to generate a second bias voltage for application to the second body connection, that second bias voltage being generated as a function of the signals at the first and second nodes;

wherein the second bias circuit comprises: fifth and sixth cross-coupled MOS transistors of the second conductivity type wherein a gate of the fifth transistor is coupled to a fifth node and a gate of the sixth transistor is coupled to a sixth node, and wherein voltages at the fifth and sixth nodes are generated as a function of the signals at the first and second nodes and a ground reference voltage node.

9. The circuit of claim 8 wherein the first bias circuit further comprises a second circuit coupled to the first and second nodes and the ground reference voltage node and adapted to apply voltages to the fifth and sixth nodes at either the ground reference voltage or a voltage less than the ground reference voltage proportional to a negative voltage at one of the first and second nodes.

10. The circuit of claim 9 wherein the second circuit applies a voltage to the fifth node which is a function of the signals at the first node and the ground reference voltage node, and applies a voltage to the sixth node which is a function of the signals at the second node and the ground reference voltage node.

11. A circuit comprising:
a first node;
a second node; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage being generated as a function of the signals at the first and second nodes; and
a second bias circuit adapted to generate a second bias voltage for application to the second body connection, that second bias voltage being generated as a function of the signals at the first and second nodes;
wherein the first bias circuit comprises: third and fourth cross-coupled MOS transistors of the first conductivity type, wherein a gate of the third transistor is coupled to a third node and a gate of the fourth transistor is coupled to a fourth node, and wherein voltages at the third and fourth nodes are generated as a function of the signals at the first and second nodes and a positive reference voltage node; and
wherein the second bias circuit comprises: fifth and sixth cross-coupled MOS transistors of the second conductivity type, wherein a gate of the fifth transistor is coupled to a fifth node and a gate of the sixth transistor is coupled to a sixth node, and wherein voltages at the fifth and sixth nodes are generated as a function of the signals at the first and second nodes and a ground reference voltage node.

12. A circuit, comprising:
a first node adapted to receive a signal;
a second node adapted to output the signal; and
a transmission gate formed solely of first and second MOS transistors coupled in parallel with each other between the first node and second node, the first MOS transistor being of a first conductivity type and having a first body connection, the second MOS transistor being of a second conductivity type and having a second body connection;
a first bias circuit adapted to generate a first bias voltage for application to the first body connection, that first bias voltage having a first variable voltage level that is equal to a positive reference voltage if the signal received at the first node is below a first threshold and transitions, when the signal received at the first node exceeds the first threshold, to a voltage in excess of the positive reference voltage and proportional to the voltage of the signal received at the first node; and
a second bias circuit adapted to generate a second bias voltage for application to the second body connection, that second bias voltage having a second variable voltage level that is equal to a ground reference voltage if the signal received at the first node exceeds a second threshold and transitions, when the signal received at the first node is below the second threshold, to a voltage less than the ground reference voltage and proportional to the voltage of the signal received at the first node.

13. The circuit of claim 12 wherein the first bias circuit comprises: third and fourth cross-coupled MOS transistors of the first conductivity type wherein a gate of the third transistor is coupled to a positive reference voltage node and a gate of the fourth transistor is coupled to receive the signal from the first node.

14. The circuit of claim 12 wherein the second bias circuit comprises: fifth and sixth cross-coupled MOS transistors of the second conductivity type wherein a gate of the fifth transistor is coupled to a ground reference voltage node and a gate of the sixth transistor is coupled to receive the signal from the first node.

15. The circuit of claim 12:
wherein the first bias circuit comprises: third and fourth cross-coupled MOS transistors of the first conductivity type wherein a gate of the third transistor is coupled to a positive reference voltage node and a gate of the fourth transistor is coupled to receive the signal from the first node; and
wherein the second bias circuit comprises: fifth and sixth cross-coupled MOS transistors of the second conductivity type wherein a gate of the fifth transistor is coupled to a ground reference voltage node and a gate of the sixth transistor is coupled to receive the signal from the first node.

* * * * *

UNITED STATES PATENT AND TRADEMARK OFFICE
CERTIFICATE OF CORRECTION

PATENT NO.        : 7,924,085 B2                                        Page 1 of 1
APPLICATION NO.   : 12/488287
DATED             : April 12, 2011
INVENTOR(S)       : Dianbo Guo It is certified that error appears in the above-identified patent and that said Letters Patent is hereby corrected as shown below:

On the Cover Page:
Item 57

Please correct the Abstract as follows:

A transmission gate includes first and second MOS transistors of opposite conductivity type coupled in parallel with each other. Each transistor includes a body connection that is separately biased by corresponding first and second biasing circuits. The first biasing circuit generates a first bias voltage having a voltage level that is generated as a function of the signal at the first node and a first (for example, positive) reference voltage. The second biasing circuit generates a second bias voltage having a voltage level that is generated as a function of the signal at the first node and a second ~~(for examples ground)~~ (for example, ground) reference voltage.

Signed and Sealed this
Sixteenth Day of August, 2011

David J. Kappos
*Director of the United States Patent and Trademark Office*